(12) United States Patent
Kamiyama et al.

(10) Patent No.: US 7,756,189 B2
(45) Date of Patent: Jul. 13, 2010

(54) TWO-LIGHT FLUX INTERFERENCE EXPOSURE DEVICE, TWO-LIGHT FLUX INTERFERENCE EXPOSURE METHOD, SEMICONDUCTOR LIGHT EMITTING ELEMENT MANUFACTURING METHOD, AND SEMICONDUCTOR LIGHT EMITTING ELEMENT

(75) Inventors: Satoshi Kamiyama, Nagoya (JP); Motoaki Iwaya, Inazawa (JP); Hiroshi Amano, Nagoya (JP); Isamu Akasaki, Nagoya (JP)

(73) Assignee: Meijo University, Nagoya-shi, Aichi-ken (JP)

( * ) Notice: Subject to any disclaimer, the term of this patent is extended or adjusted under 35 U.S.C. 154(b) by 93 days.

(21) Appl. No.: 11/897,895

(22) Filed: Aug. 31, 2007

(65) Prior Publication Data

US 2008/0123713 A1 May 29, 2008

Related U.S. Application Data

(63) Continuation of application No. PCT/JP2006/303288, filed on Feb. 23, 2006.

(30) Foreign Application Priority Data

Mar. 1, 2005 (JP) .............................. 2005-056285

(51) Int. Cl.
*H01S 3/08* (2006.01)
*H01S 5/00* (2006.01)
*G01B 9/02* (2006.01)
*G01B 11/02* (2006.01)

(52) U.S. Cl. ...................... 372/103; 372/45.01; 372/92; 356/479; 356/497

(58) Field of Classification Search ................. 372/103, 372/45.01, 92; 356/479, 497
See application file for complete search history.

(56) References Cited

U.S. PATENT DOCUMENTS 5,248,990 A * 9/1993 Ishikawa et al. ............ 347/262
6,304,318 B1 * 10/2001 Matsumoto .................. 355/55

FOREIGN PATENT DOCUMENTS

JP          05-267717          10/1993

(Continued)

OTHER PUBLICATIONS

Wang Xiangyang, et al: "Production of fiber Bragg grating and application in strain sensors system" Proceedings of the SPIE, vol. 2594, 1996, pp. 114-211.*

(Continued)

*Primary Examiner*—Minsun Harvey
*Assistant Examiner*—Patrick Stafford
(74) *Attorney, Agent, or Firm*—Yokoi & Co., U.S.A., Inc.; Toshiyuki Yokoi

(57) ABSTRACT

The present invention discloses a two-light flux interference exposure device comprising: a laser light source provided in a laser resonator; a single harmonic generation device provided in the laser resonator for converting laser light output by the laser light source to higher harmonics; an etalon provided in the laser resonator so as to serve as a narrowband wavelength filter; a beam splitter dividing laser light output outside the laser resonator into two light fluxes; and an interference optic system causing the light fluxes to interfere with each other on a target to be exposed.

7 Claims, 7 Drawing Sheets

FOREIGN PATENT DOCUMENTS

| | | |
|---|---|---|
| JP | 09-260759 | 10/1997 |
| JP | 2000-021713 | 1/2000 |
| JP | 2002-016312 | 1/2002 |
| JP | 2003-086835 | 3/2003 |

OTHER PUBLICATIONS

The extended European search report includes, pursuant to Rule 62 EPC, the supplementary European search report (Art. 1.53(7) EPC) and the European search opinion.

Wang Xiangyang, et al: "Production of fiber Bragg grating and application in strain sensors system" pp. 114-119.

Anonymous: "Lexel Laser 95-SHG".

Grant J, et al: "Fabrication of a Fiber-Optic Tilted Bragg Grating Filter in 40 nm Range with a Single Phase Mask" pp. 1038-1044.

International Search Report for PCT/JP2006/303288 dated May 30, 2006.

* cited by examiner

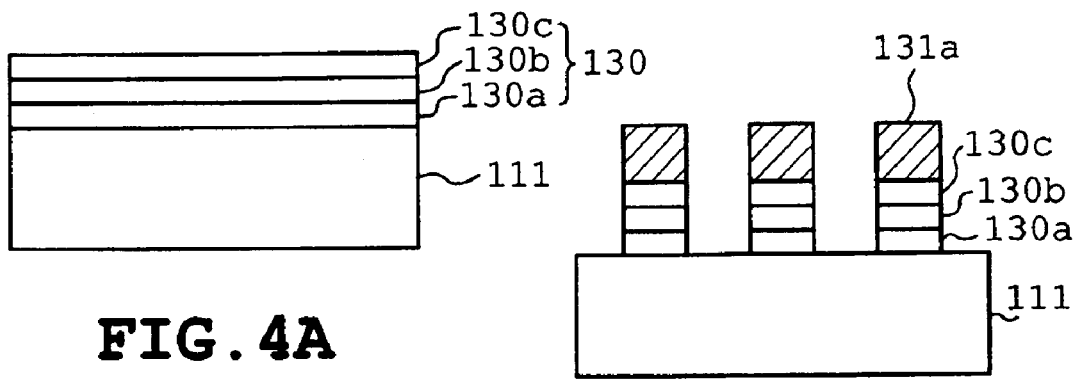
FIG. 4A
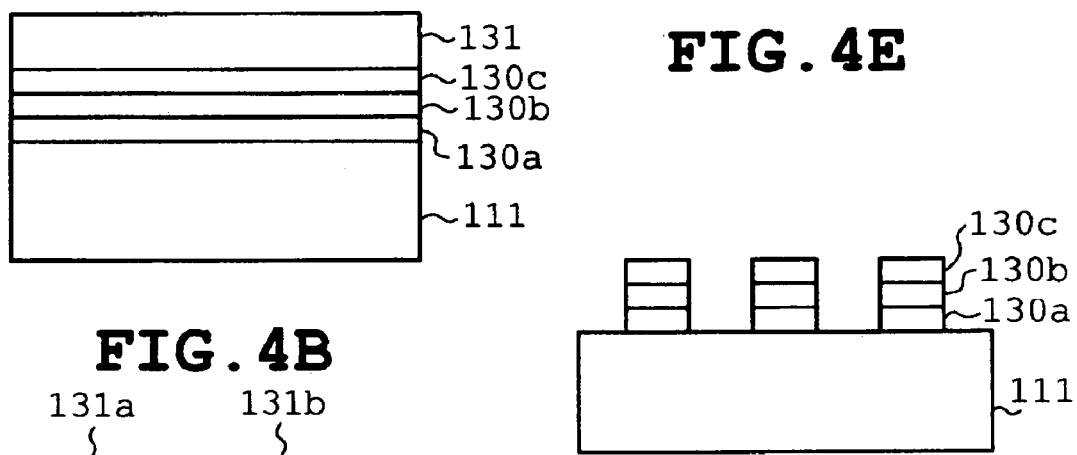
FIG. 4B
FIG. 4C
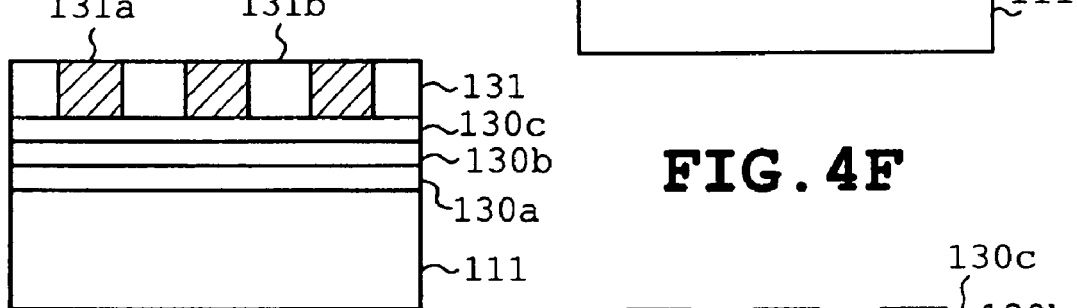
FIG. 4D
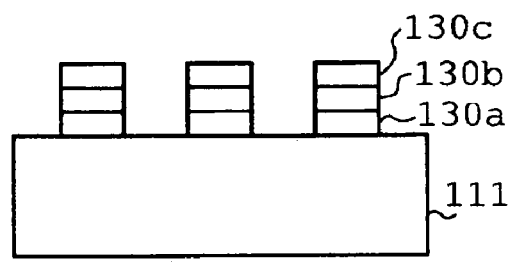
FIG. 4E
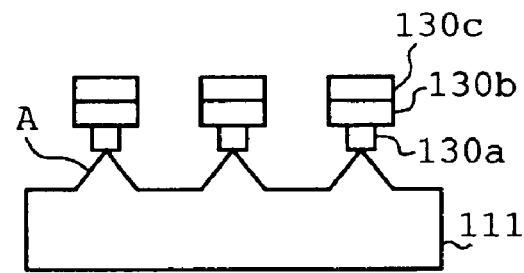
FIG. 4F
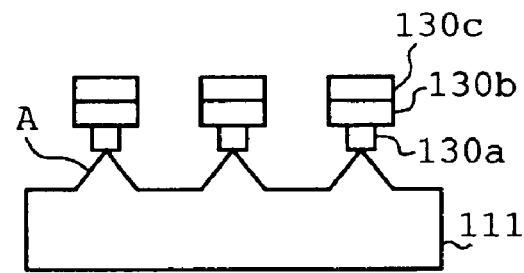
FIG. 4G

TWO-LIGHT FLUX INTERFERENCE EXPOSURE DEVICE, TWO-LIGHT FLUX INTERFERENCE EXPOSURE METHOD, SEMICONDUCTOR LIGHT EMITTING ELEMENT MANUFACTURING METHOD, AND SEMICONDUCTOR LIGHT EMITTING ELEMENT

CROSS-REFERENCES TO RELATED APPLICATIONS

This Application claims the benefit of priority and is a Continuation application of the prior International Patent Application No. PCT/JP2006/303288, with an international filing date of Feb. 23, 2006, which designated the United States, and is related to the Japanese Patent Application No. 2005-056285, filed Mar. 1, 2005, the entire disclosures of all applications are expressly incorporated by reference in their entirety herein.

BACKGROUND OF THE INVENTION (1) Field of the Invention

The present invention relates to a two-light flux interference exposure device, a two-light flux interference exposure method, a semiconductor light emitting element manufacturing method, and a semiconductor light emitting element.

(2) Description of Related Art

Light-emitting diodes have widely been put into practical use as semiconductor light emitting elements by p-n junction of a compound semiconductor and employed mainly for purposes of optical transmission, display and special illumination. Recently, a white light-emitting diode using a nitride semiconductor and a phosphor has also been put into practical use. The white light-emitting diode is greatly expected to be developed into use for general lighting in the future. However, since particularly the white light-emitting diode has an insufficient energy conversion efficiency as compared with existing fluorescent lamps, the white light-emitting diode necessitates significant improvement in the efficiency for use as general lighting. A major cause of low energy conversion efficiency is a low efficiency in extraction of light out of a light-emitting diode but not a low luminance efficiency of a semiconductor. A semiconductor generally has a high refractive index ranging from about 2.5 to about 4. Accordingly, when light generated inside a light-emitting layer is externally extracted, about 20% to 30% Fresnel reflection and refraction of a radiation angle occur on a light extraction surface. When a critical angle has been exceeded, the refraction of a radiation angle causes total reflection such that all the light is confined to the inside of the element. The confined light is absorbed into semiconductor layers, electrodes or the like thereby to be attenuated, while repeating reflection in the inside of the element. Consequently, the light changes to heat. General light emitting diodes have a light extraction efficiency of about 20%, and accordingly, 80% light is lost in the inside of the element.

The structure that a semiconductor surface is corrugated is suggested in order that the aforesaid problem may be overcome (see JP-A-2003-86835, for example). When such a corrugated structure is provided on the semiconductor surface at a light-extracting side, the effect of light scatter causes total reflection to disappear, so that the optical transmittance of nearly 50% can be obtained over a wide radiation angle. When it is assumed that a back contact has a 100% reflectance, the light extraction efficiency can be increased nearly 50%. Furthermore, the inventors have confirmed that the light extraction efficiency can be increased to 70 to 80% when a period of the corrugated structure is reduced approximately to an optical wavelength of a light emitting diode. Since the wave nature of light in the corrugated structure is actualized by reducing the period of the corrugated structure approximately to the optical wavelength of the light emitting diode. The light transmittance is improved by a refractive effect. Although different names such as photonic crystal and motheye structure are used depending upon a shape of the periodic corrugated structure, the same principle is employed for improving the light extracting efficiency.

However, it is not easy to make a periodic structure with a wavelength order used in the photonic crystal or motheye structure. Furthermore, there is also a problem that the manufacturing costs are high. For example, in the case of a blue light emitting diode made from a nitride, an optic wavelength needs to be set to 184 nm and a convex portion of the corrugated structure needs to have a width set to about 90 nm when the wavelength of light to be emitted is set to 460 nm and the nitride crystal has a refractive index of 2.5. It is difficult to make a periodic structure having such a size even by a mot-advanced photolithography technique using a current ArF excimer laser. Moreover, it is impossible from the point of costs to use such an extremely expensive manufacturing apparatus for manufacture of photo diodes. No apparatus for manufacture of compound semiconductors with a small substrate diameter is available. Furthermore, an electron photolithography process used for manufacture of current photonic crystal or motheye structure has an extremely low productivity and accordingly cannot be used for manufacture of low cost light emitting diodes.

BRIEF SUMMARY OF THE INVENTION

The present invention discloses a two-light flux interference exposure device comprising: a laser light source provided in a laser resonator; a single harmonic generation device provided in the laser resonator for converting laser light output by the laser light source to higher harmonics; an etalon provided in the laser resonator so as to serve as a narrowband wavelength filter; a beam splitter dividing laser light output outside the laser resonator into two light fluxes; and an interference optic system causing the light fluxes to interfere with each other on a target to be exposed.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout:

FIGS. 4A to 4G are exemplary views explaining steps of forming the corrugated structure;

DETAILED DESCRIPTION OF THE INVENTION

The detailed description set forth below in connection with the appended drawings is intended as a description of presently preferred embodiments of the invention and is not intended to represent the only forms in which the present invention may be constructed and/or utilized.

Embodiments of the present invention will be described in the following order:

A. An arrangement of the two light flux interference exposure device;

B. A method of fabricating a semiconductor light-emitting device;

C. A semiconductor light-emitting device of a modified form; and

D. Summary.

A. An Arrangement of the Two Light Flux Interference Exposure Device

Figure 1:
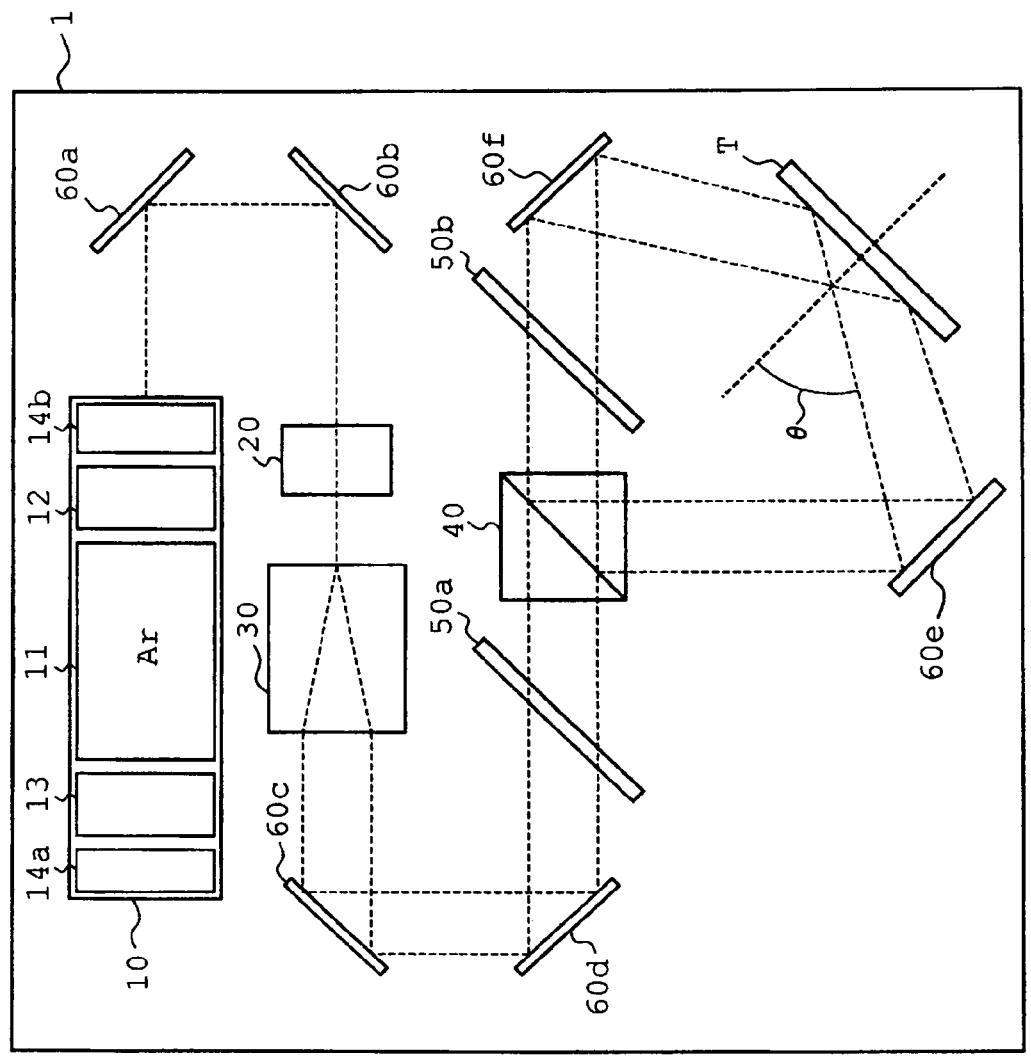
FIG. 1 is an exemplary schematic arrangement diagram of the two light flux interference exposure device.

FIG. 1 illustrates the arrangement of a two light flux interference exposure device of an embodiment of the present invention. Dot line in the figure shows a path of laser light. A two light flux interference exposure device 1 comprises a laser resonator 10, half-wave plate 20, beam expander 30, beam splitter 40, ND filters 50a and 50b, and mirrors 60a, 60b, 60c, 60d, 60e and 60f. The laser resonator 10 comprises an Ar laser light source 11, SHG (single harmonic generation) element 12, etalon 13, and a pair of resonance mirrors 14a and 14b.

The Ar laser light source 11 is capable of generating light having a wavelength of about 488 nm by excitation of an Ar gas. The light emitted in the Ar laser light source 11 is repeatedly reflected on the resonant mirrors 14a and 14b confronting in parallel with each other, whereby laser light can be output. The Ar laser light source 11 can achieve relatively higher output of laser light. The SHG element 12 is provided between the resonant mirrors 14a and 14b with which laser light resonates. The SHG element 12 has a property that when laser light is incident, the SHG element 12 generates light having a frequency which is a multiple of the frequency of the incident light. Accordingly, when laser light having a wavelength of about 488 nm is incident, the SHG element 12 can generate a higher harmonic having a wavelength of about 244 nm.

The SHG element 12 provides a certain range of the wavelength spectrum although the harmonic laser light has a wavelength spectrum whose peak is at about 244 nm. More specifically, the laser light contains various wavelength components at the time the laser light is converted to higher harmonic by the SHG element 12. On the other hand, the etalon 13 is provided between the resonant mirrors 14a and 14b with which the laser light resonates. The etalon 13 serves as a narrowband wavelength filter in the present invention and can allows only the laser light with a predetermined wavelength to pass therethrough. In the embodiment, the etalon 13 is composed of two flat glasses confronting in parallel with each other with a predetermined distance therebetween and a transmission plate disposed between the flat glasses. The etalon 13 allows to pass therethrough only the laser light with wavelength according to the distance between the flat glasses and a refraction index of the transmission plate. The transmission plate has different refraction indexes according to a wavelength of incident light and is refracted by a refracting angle that allows the light to pass through the etalon 13.

According to the laser resonator 10 arranged as described above, a narrow-band limited single wavelength laser light with a wavelength of about 244 nm can be output and has a coherence length which can be set so as to exceed 10 m. Accordingly, desired two laser light interference can be caused even when the path of the laser light from the laser resonator 10 to the target to be exposed is rendered longer. On the other hand, when the etalon 13 is not provided, laser light output from the laser resonator 10 contains wavelength components belonging to a broad band, whereupon the coherence length to be obtained is not more than about several tens centimeters long.

The laser light output from the laser resonator 10 is reflected on the mirrors 60a and 60b thereby to be incident on the half-wave plate 20. A polarization ratio is increased by the half-wave plate 20. Laser light contains no less than several % orthogonal polarization component orthogonal to main orthogonal component although the laser light is basically linearly polarized light. Laser light contains a small amount of polarization component orthogonal to a direction as shown by dotted line in FIG. 1. The half-wave plate 20 reduces the orthogonal polarization component, thereby increasing a polarization ratio of the main polarization component to the orthogonal polarization component.

Laser light is caused to be incident on the beam expander 30 after the orthogonal polarization component has been reduced by the half-wave plate 20. When laser light contains a large amount of orthogonal polarization component, the birefringency of a transmission type optical component causing refraction, such as the beam expander 30, results in a path difference or phase difference between the orthogonal polarization component and the main polarization component. In the embodiment, however, the laser light is caused to be incident on the beam expander 30 after reduction in the orthogonal polarization component by the half-wave plate 20. As a result, an amount of influence of birefringency due to the orthogonal polarization component is small such that in-phase parallel light can be generated by the beam expander 30, whereupon desired coherence can be retained. The beam expander 30 can be comprised of two refractive lenses, for example and accordingly, parallel light with a predetermined width can be generated.

Laser light output from the beam expander 30 is reflected on the mirrors 60c and 60d thereby to be incident on the ND filter 50a. The ND filter (neutral density filter) is a darkening filter and can adjust an amount of laser light to a suitable value by adjusting a fading rate. The ND filters 50a and 50b may be of the reflection type although the transmission type ND filters 50a and 50b are used in the embodiment. Laser light attenuated by the ND filter 50a is divided by the beam splitter 40 into two light beams substantially orthogonal to each other.

The laser light having passed through the beam splitter 40 is attenuated by the ND filter 50b and then reflected on the mirror 60f so as to be incident on the target T to be exposed at an incident angle ◘.On the other hand, the laser light reflected on the beam splitter 40 is further reflected on the mirror 60e, thereby reaching the target T to be exposed at the incident angle ◘.Since an amount of light passing through the beam splitter 40 is larger than an amount of light reflected on the beam splitter 40 in the embodiment, the laser light having passed through the beam splitter 40 is further caused to pass through the ND filter 50b so that laser light reflected on and having passed through the beam splitter 40 is equalized to each other. The ND filters 50a and 50b and beam splitter 40 are transmission type optical devices. Since the orthogonal polarization component is previously reduced by the half-wave plate 20, desired coherence can be retained.

Figure 2:
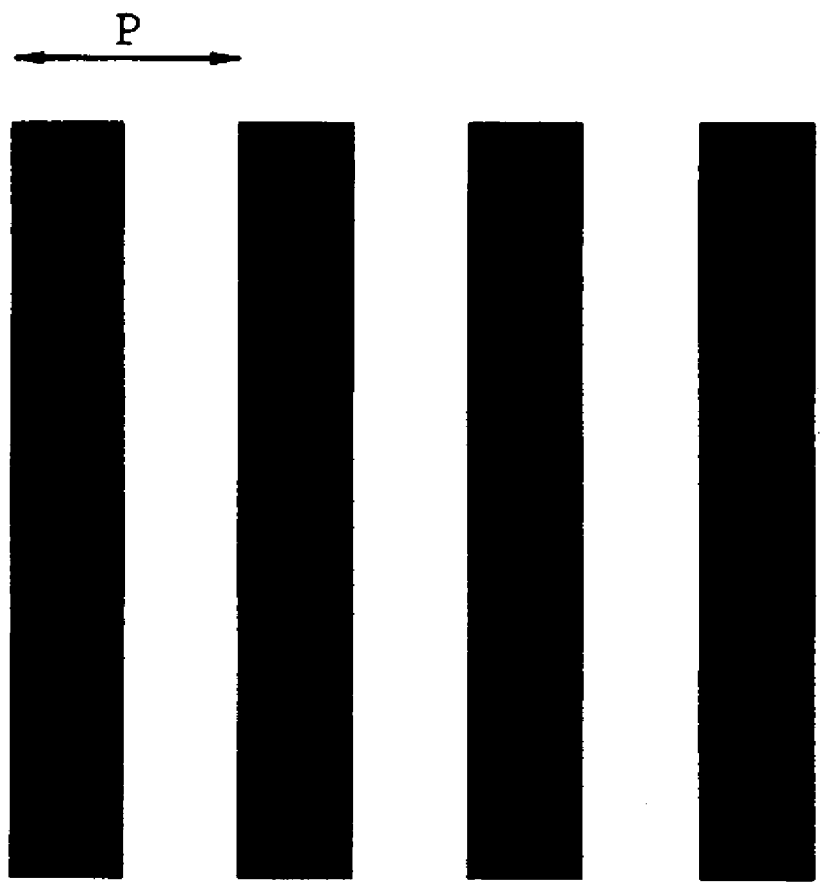
FIG. 2 is an exemplary diagram showing an interference fringe.

Two light fluxes are caused to be incident on the target T to be exposed by the above-described arrangement, so that interference fringe as shown in FIG. 2 can be formed on the target T. When $\lambda$ is a wavelength of laser light, a period P of interference fringe formed on the target T is given by the following equation (1):

$$P = \lambda/2 \sin\theta \qquad (1)$$

For example, when the incident angle $\theta$ is 60° and the wavelength $\lambda$ is 244 nm, the period P of the interference fringe is about 141 nm. When a photoresist having photosensitivity to the laser light in the embodiment is formed on the target T, the photoresist can be exposed to light into the same interference fringe as in FIG. 2. When a commercially available high-power Ar laser is used, the two laser light exposure device 1 of the embodiment can achieve an effective power of about 50 mW. For example, the mean laser power density obtained when laser light is enlarged into a diameter of 10 cm is 0.64 mW/cm$^2$. In this case, when a photoresist having an appropriate amount of exposure of 25 mJ/cm$^2$ is applied as the photoresist, exposure can be completed in about 20 seconds. More specifically, a 2- or 3-inch substrate is often used in pattern formation of a compound semiconductor. Exposure of such a substrate can be realized with the same easiness as in a general photolithography process.

Since the period P of interference fringe depends upon the incident angle $\theta$ in the aforesaid equation (1), the incident angle $\theta$ is adjusted such that the period P of interference fringe can be adjusted. The mirrors 60e and 60f causing the laser light to be incident on the target T correspond to an interference optic system in the present invention. Additionally, when exposure is carried out with the use of double higher harmonics of the Ar laser as in the embodiment, a theoretical limit period is 122 nm. The interference fringe can be formed when the period P is equal to or larger than 122 nm. Furthermore, since a width of the interference fringe, that is, a duty ratio of an exposed portion to an unexposed portion can be adjusted by adjustment of an exposure time, the periodical structure formed by the two laser light has a high degree of freedom in a shape thereof. As described above, the coherence of the laser light is retained until reach to the target T. Accordingly, a desired interference fringe can be formed on the target T.

Although the Ar laser is used as the light source in the foregoing embodiment, an Nd doped YAG laser may be used, instead. Laser light output by the Nd doped YAG laser has a wavelength of 10.6 $\mu$m. Accordingly, when the laser light is converted to quadruple higher harmonics by the SHG element, laser light having an optical wavelength of 10.6 $\mu$m can be obtained. Consequently, substantially the same period P as that in the previous embodiment can be generated.

Figure 3:
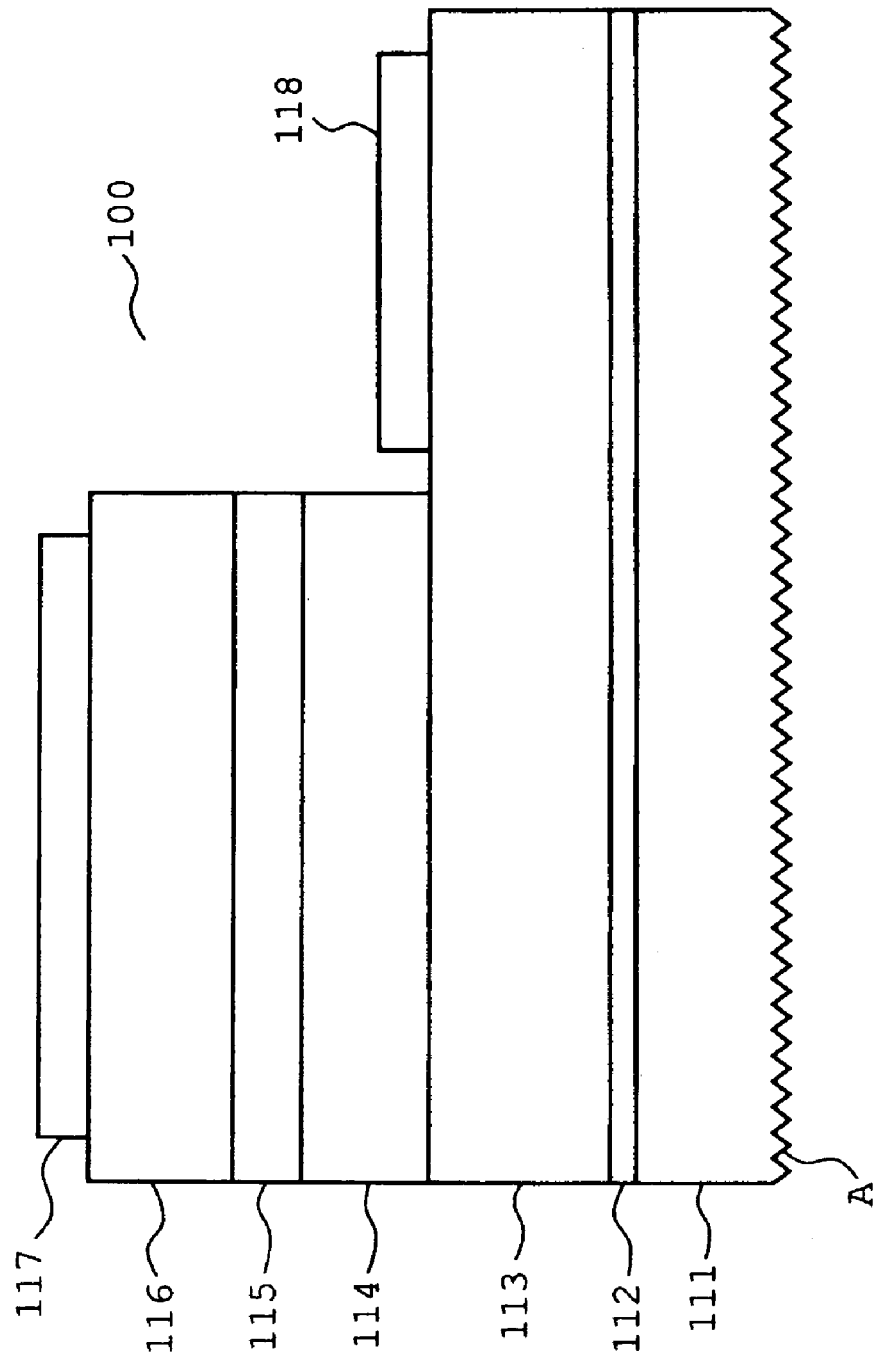
FIG. 3 is an exemplary view showing a frame format of the structure of blue light-emitting diode.

B. A Method of Fabricating a Semiconductor Light-Emitting Device:

FIG. 3 shows a frame format of the arrangement of a blue light-emitting diode 100 as the semiconductor light-emitting device of an embodiment. In the figure, the blue light-emitting diode 100 comprises a substrate 111, low-temperature buffer layer 112, clad layer 113, emission layer 114, barrier layer 115, contact layer 116, p-electrode 117, and n-electrode 118 each of which is generally formed into a plate shape. The plate-shaped substrate 111 composing a lowermost layer is made of SiC. Deposited on a surface of the substrate 111 are the low-temperature buffer layer 112 made of AlGaN (group III nitride semiconductor), clad layer 113 made of n-GaN, emission layer 114 made of GaInN, barrier layer 115 made of p-AlGaN and contact layer 116 made of p-GaN sequentially in this order. Furthermore, a plate-shaped p-electrode 117 is deposited on the uppermost contact layer 116. An n-electrode 118 is deposited on the clad layer 113. A periodic corrugated structure A is formed on the backside of the substrate 111.

In the above-described arrangement, light can be emitted by the emission layer 114 when forward bias voltage is applied between the p-electrode 117 and the n-electrode 118 of the blue light-emitting diode 100. The emission layer 114 emits the light with a wavelength suitable for a band gap thereof. The emission layer 114 has a mean optic wavelength of about 220 nm in the embodiment. The optic wavelength refers to a value obtained by dividing actual wavelength by a refraction factor. The substrate 111, low-temperature buffer layer 112, clad layer 113, emission layer 114, barrier layer 115 and contact layer 116 each have translucency, whereby light emitted by the emission layer 114 can be extracted from the underside of the substrate 111. More specifically, the underside of the substrate 111 constitutes a light extraction surface in the blue light-emitting diode 100. Light extracted from the light extraction surface can be used for illumination or the like.

Since a mean period (about 200 nm) of the periodical corrugated structure A is smaller than the optic wavelength (about 220 nm) of the emitted light, the difference between refraction factors of air and the substrate 111 is reduced by the periodical corrugated structure A. Accordingly, since an acute change in the refraction factor between air and the substrate 111 is alleviated, light emitted by the emission layer 114 can be prevented from being confined inside the emission layer as the result of total reflection on the light extraction surface, whereupon a high light extracting efficiency can be realized.

The following describes a method of forming a periodic corrugated structure A on the substrate 111. FIGS. 4A to 4G schematically show the steps of forming the corrugated structure A. Firstly, as shown in FIG. 4A, a thin film-shaped etching mask 130 is deposited on the underside of the substrate 111 corresponding to the light extracting surface. The etching mask 130 is formed by depositing on the underside of the substrate 111 the thin film-shaped SiO$_2$ layer 130a made from SiO$_2$, Ti layer 130b made from Ti and Au layer 130c made from Au sequentially in this order. More specifically, the etching mask 130 is composed of a plurality of thin film layers made from different materials. The SiO$_2$ layer 130a, Ti layer 130b and Au layer 130c are deposited for example, by a vacuum deposition.

Subsequently, a thin film-shaped photoresist mask 131 is formed on the etching mask 130 as shown in FIG. 4B. The photoresist mask 131 has a substantially uniform thickness of about 0.1 $\mu$m. A photoresist solution with a low viscosity is applied to the etching mask 130 by spin coat and is then prebaked such that the photoresist mask 131 having an exceedingly thin film thickness can be formed. Subsequently, as shown in FIG. 4C, the photoresist mask 131 is exposed to light using the aforesaid two laser light interference exposure device 1. The substrate 111 is set as the target T to be exposed. Two light fluxes are caused to be incident on the photoresist mask 131 for 10 seconds so that the photoresist mask 131 is exposed to light so as to have an interference fringe pattern.

Figure 5A:
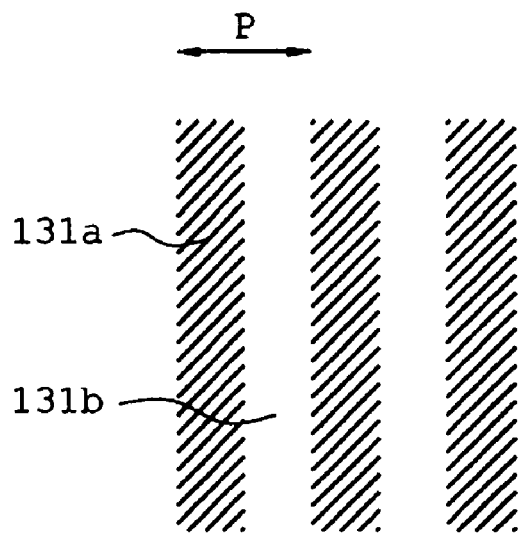
FIGS. 5A and 5B are exemplary views showing a manner of exposing a photoresist mask to light.
Figure 5B:
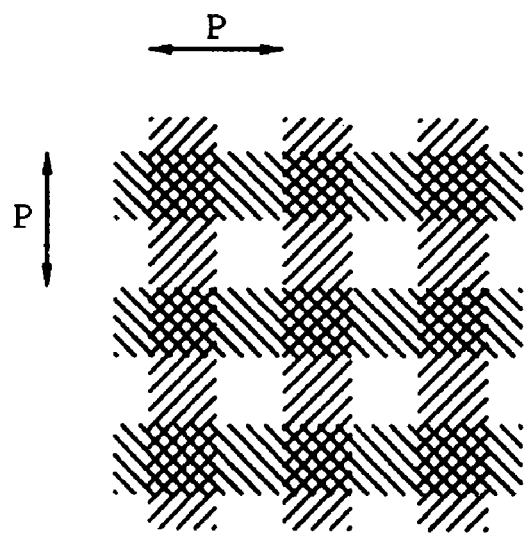

FIGS. 5A and 5B show the photoresist mask 131 after exposure as viewed in the thickness direction. In FIG. 5A, an exposed portion 131a and an unexposed portion 131b are distinguished from each other by presence or absence of hatching. The exposed and unexposed portions 131a and 131b are the same as the interference fringe shown in FIG. 2. Subsequently, the substrate 111 is rotated 90° so that a second exposure is carried out under the same condition. FIG. 5B shows the photoresist mask 131 after the second exposure. The first and second exposed portions 131a are hatched in the directions opposed to each other in FIG. 5B. Each intersecting hatched portion corresponds to a double exposed portion. An accumulated exposure time is 20 sec. regarding each double exposed portion. Thus, a pattern of intersecting interference fringes is formed on the photoresist mask 131 when the exposure direction is rotated 90°. As a result, square double exposure portions can be formed. Furthermore, a two-dimensional mask pattern can be formed when exposure is carried out at a plurality of times.

Upon completion of the second exposure, a development process is carried out so that the portion of the photoresist mask 131 other than the double exposed portions is removed. As a result, as shown in FIG. 4D, only the square double exposed portion remains. As described above, the two-dimensional periodic exposure pattern can be formed by the two laser light interference exposure method.

Upon completion of the development process, the etching mask 130 is etched with the remaining photoresist 131 serving as a resist mask as shown in FIG. 4E. In etching the etching mask 130, the $SiO_2$ layer 130a, Ti layer 130b and Au layer 130c can be etched by a reactive ion etching process in which for example, a chlorine gas is used. Upon completion of the etching of the etching mask 130, the photoresist mask 131 is completely removed by a film separating process as shown in FIG. 4F.

Subsequently, the reactive ion etching process is again carried out using tetrafluoromethane or a mixed gas of tetrafluoromethane and oxygen. In this case, tetrafluoromethane ion results in side etching in the lowermost $SiO_2$ layer 130a. As a result, an effective mask size is reduced with lapse of time as shown in FIG. 4G. However, each of the upper Ti layer 130b and Au layer 130c has a relatively higher resistance to side etching and a lower etching speed. Accordingly, the $SiO_2$ layer 130a is not removed completely, so that the mask can be formed into an inclined shape. The inclined mask shape can expedite side etching in the direction parallel to the substrate 111, whereupon the periodic corrugated structure A with a four-sided pyramid can be formed. This corrugated structure A is called "motheye structure." Since variations in a sectional area in the direction of light extraction is gentle so that a highest light extraction effect can be realized. The etching mask 130 may be removed by another step after etching. Alternatively, the etching mask 130 may be separated by continuing the side etching.

Although the SiC substrate 111 is used as the light extraction surface in the embodiment, the corrugated structure can be made from another semiconductor material. For example, in the case of each of GaAs, InP, GaP, GaN or sapphire, the pattern of the corrugated structure can be formed with the use of the similar etching mask to that in the embodiment and a etching gas suitable for each material. Furthermore, although each convex portion of the corrugated structure is shaped into the four-side pyramid after etching in the embodiment, the corrugated structure may be formed so as to have each conical convex portion by carrying out a wet etching process after etching so that square corners are selectively removed.

Figure 6:
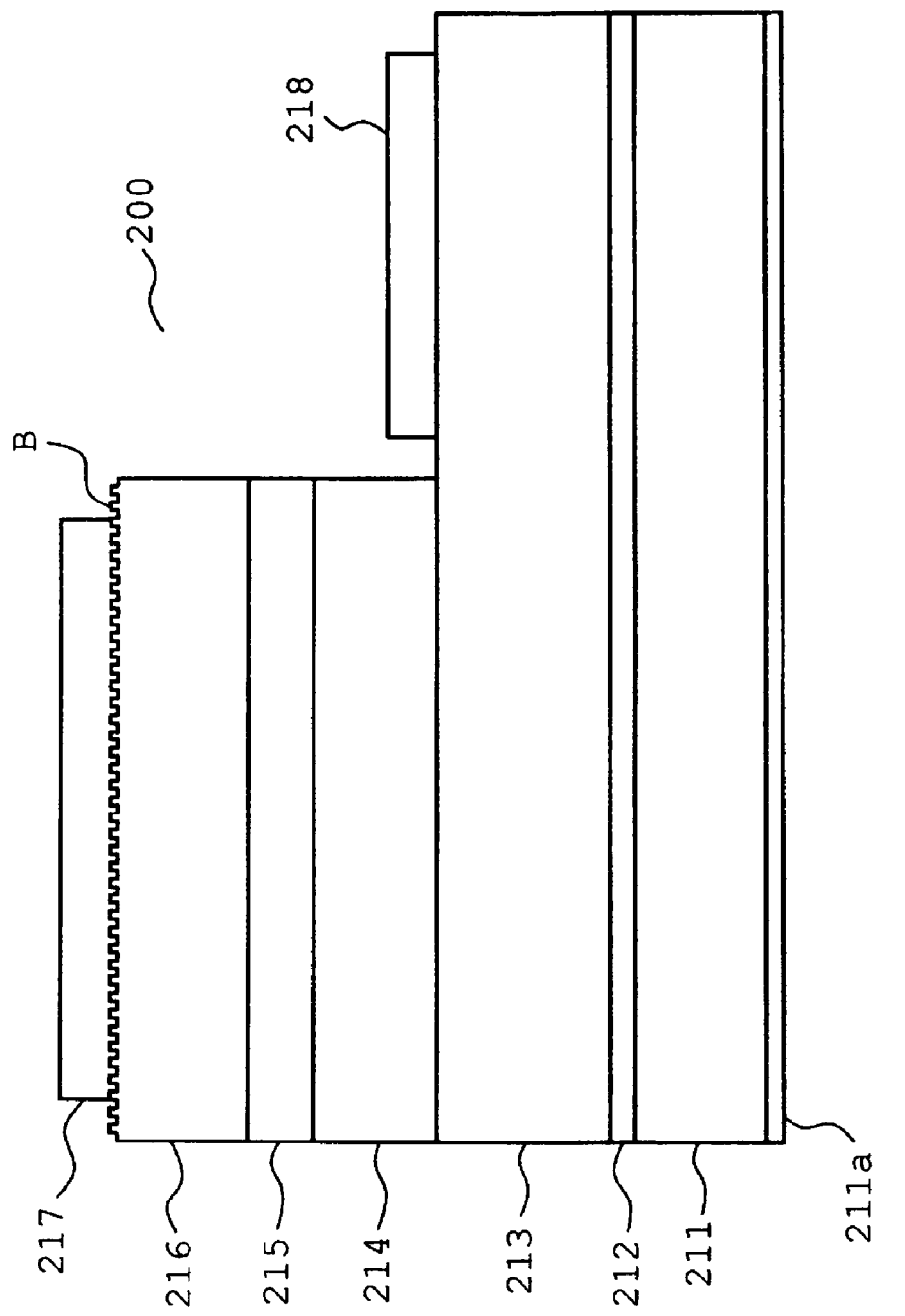
FIG. 6 is an exemplary view showing a frame format of a modified structure of blue light-emitting diode.

C. Modified Form of Semiconductor Light-Emitting Device:

FIG. 6 schematically shows an arrangement of blue light-emitting diode as a semiconductor light-emitting device of a modified form. In FIG. 6, the blue light-emitting diode 200 comprises a substrate 211 made of sapphire, low-temperature buffer layer 212 made of AlGaN, clad layer 213 made of n-GaN, emission layer 214 made of GaInN, barrier layer 215 made of p-AlGaN and contact layer 216 made of p-GaN all of which are deposited one upon another sequentially in this order. A translucent electrode 217 made of translucent Ni/Au and a p-electrode 218 are deposited on the uppermost contact layer 216. An n-electrode 219 is deposited on the clad layer 213. A reflection mirror 211a is formed on the underside of the sapphire substrate 211. Light emitted inside the blue light-emitting diode 200 is totally reflected on the reflection mirror 211a upward. More specifically, light is extracted upward in the modified form, and the surface of the CaN contact layer 216 constitutes the light extraction surface. A periodic corrugated structure B is formed on the contact layer 216.

Figure 7A:
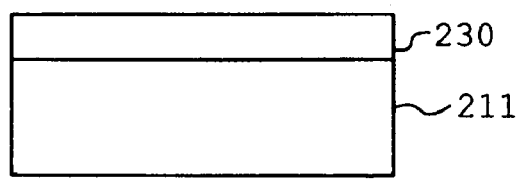
FIGS. 7A to 7G are exemplary views explaining steps of forming the modified corrugated structure.
Figure 7B:
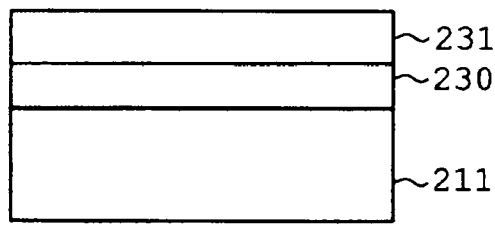
Figure 7C:
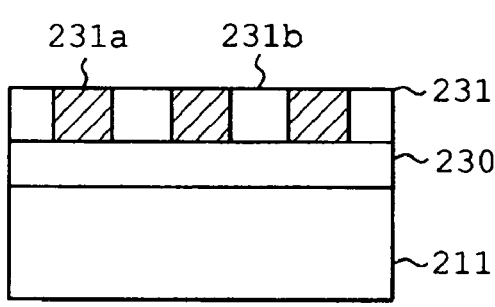
Figure 7D:
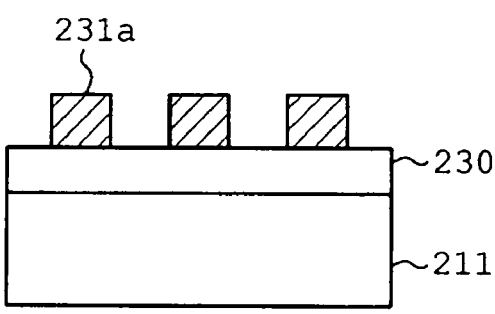
Figure 7E:
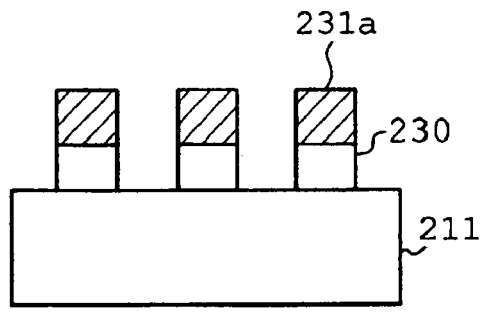
Figure 7F:
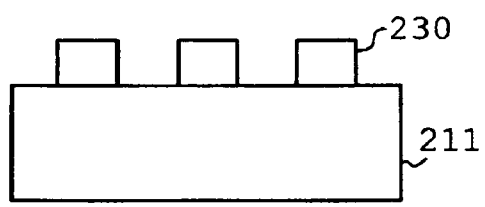
Figure 7G:
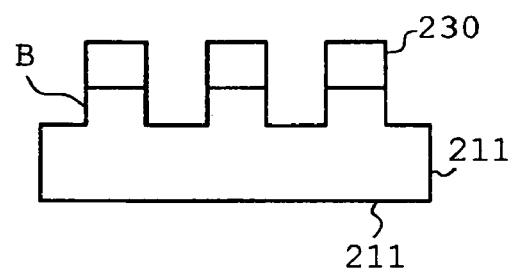

FIGS. 7A to 7G schematically show the steps of forming the corrugated structure B. The etching mask 230 and the photoresist mask 231 are formed on the contact layer 216. The etching mask 230 is composed of a single layer of $SiO_2$ in the modified form. Exposure, development process, etching for the etching mask 230 and film exfoliation are carried out in the same manners as those in the foregoing embodiment. An ion etching process is then carried out with the etching mask 230 serving as a etching resist mask using chlorine gas. In this case, only openings of the mask are electively etched in the contact layer 216 such that the periodic corrugated structure B including quadrangular prism-shaped convex portions is formed as shown in FIG. 7E.

Shortening the etching time can suppress side etching, so that the convex portions can be retained in the quadrangular prism shape. This periodic structure is called "photonic crystal" and can achieve a high light extraction efficiency. Furthermore, although the convex portions of the corrugated structure A become quadrangular prism-shaped after etching in the foregoing embodiment, square corners may selectively be removed by carrying out a wet etching process after removal of the etching mask 130 so that a column-shaped corrugated structure is formed.

D. Summary

The two-light flux interference exposure device can be realized which has as a light source double higher harmonics of an Ar laser or quadruple higher harmonics of an Nd doped YAG laser and can generate laser light with high homogeneous and coherence by the etalon and half-wave plate. Furthermore, the photoresist mask is exposed to light for the periodic pattern by the aforesaid two-light flux interference exposure and then developed. The pattern of a semiconductor layer etching mask is formed with the resist pattern serving as a mask. After removal of the resist pattern, the light extraction surface is etched, whereupon the semiconductor light-emitting device with high energy conversion efficiency can be fabricated at lower costs. Although the preferred embodiment of the present invention has been described in detail with reference to the accompanying drawings, it will be understood for those of ordinary skill in the art that the embodiment can be modified without departing form the technical idea of the invention defined in the appended claims.

In the present invention, a laser light source, an SHG device and an etalon are provided in a laser resonator. The laser light source externally receives energy thereby to generate laser light. The SHG device converts laser light output by the laser light source to higher harmonics in the laser resonator. More specifically, the laser light output from the laser light source is converted so as to a short wavelength. The SHG (second-harmonic generation) device comprises an optical crystal on which laser light is incident so that the optical crystal generates light having a frequency which is a multiple of the frequency of the incident light.

The etalon serves as a narrowband wavelength filter in the laser resonator, extracting only laser light with a predetermined wave length. The etalon may be formed by two flat glasses confronting in parallel with each other with a predetermined distance therebetween. In this case, the etalon can transmit only the laser light having a wavelength according to the distance between the flat glasses. The wavelength of the laser light resonating in the laser resonator can strictly be changed to a monolithic wavelength as the result of the above-described arrangement. Consequently, laser light which is suitable for two light flux interference and has good coherence can be output out of the laser resonator. Accordingly, the two light flux interference can be caused to occur even when a light path from the laser light source to a target to be exposed to light is rendered longer. Furthermore, since a period of interference fringe resulting from the two light flux interference exposure depends upon a laser light wavelength, a fine interference fringe can be formed when laser light is converted to a higher harmonic by an SHG element.

The beam splitter divides a laser light output outside the laser resonator to two light beams. While concentrating the light on the target to be exposed to light, the interference optic system causes the laser light to interfere with each other at a suitable angle, thereby producing an interference fringe on the target. The interference fringe thus produced is caused to act on the photoresist on the target such that the photoresist can be exposed to light so as to have the same pattern shape as the interference fringe. Consequently, a fine pattern of can easily be formed on the semiconductor light emitting device.

Furthermore, in another aspect of the present invention, the laser light source is an Ar laser light as an example of the suitable laser light source forming an extremely fine pattern in the semiconductor light emitting diode. According to the Ar laser light source, since laser light having a wavelength of about 488 nm can be oscillated, a higher harmonic having the wavelength of about 244 nm can be obtained when laser light is converted to a double higher harmonic by the SHG element. Accordingly, a fine pattern can be formed on the semiconductor light-emitting device.

Furthermore, as another example of the laser light source suitable for forming a fine pattern, in an optional aspect of the present invention, the laser light source is an Nd doped YAG laser light source and the SHG device converts the laser light output by the laser light source into quadruple higher harmonic. According to the Nd doped YAG laser light source, laser light is converted to a quadruple higher harmonic by the SHG element such that a higher harmonic having a wavelength of about 266 nm can be obtained.

Furthermore, as a suitable configuration in which the present invention is applied to a transmission type optic system which transmits laser light through a medium having a high refractive index, in another aspect of the present invention, a half-wave plate is provided for reducing an orthogonal polarization component of the laser light output outside the laser resonator. The half-wave plate is a thin plate-shaped element composed of doubly refracting crystal and has a property of rotating a polarization plane of the laser light. The laser light output outside the laser resonator travels through the half-wave plate such that an orthogonal polarization component of the laser light can be reduced. The reduction in the orthogonal polarization component can suppress influences of the orthogonal polarization component upon the speed of light in the case where laser light transmits the transmission type optic system. More specifically, even when the transmission type optic system is applied to the laser light, the laser light speed can be prevented from variations due to changes in the orthogonal polarization component. Accordingly, even when laser light output outside the laser resonator is converted to parallel light having a predetermined width by a beam expander, the phase of the parallel light after conversion can be prevented from variations, whereupon desirable coherence can be retained.

Furthermore, the technical idea of the present invention can also be realized in the method of manufacturing a semiconductor light-emitting device in accordance with the above-described method. More specifically, the two light flux interference exposure method can be treated as a part of the method of manufacturing the semiconductor light-emitting device, and it is possible to incorporate each step of the two light flux interference exposure method into the steps of the method of manufacturing the semiconductor light-emitting device.

In the method, a light extraction surface is provided on the surface of the semiconductor light-emitting device so that light emitted in the light-emitting layer is output out of the light-emitting surface. A thin film-shaped etching mask is formed on the light extraction surface, and a thin film-shaped photoresist mask is further formed on the etching mask. The photoresist mask on the light extraction surface is then exposed to light by the above-described two light flux interference exposure method. Subsequently, a development process is carried out so that an unexposed portion of the photoresist mask is removed. Subsequently, a pattern is formed on the etching mask with the photoresist mask serving as a resist mask. Thus, a pattern corresponding to an interference fringe in the two laser light interference can be formed on the etching mask. The light extraction surface is etched with the etching mask formed with the pattern serving as a resist mask. Consequently, a pattern corresponding to the interference fringe in the two light flux interference can be formed on the light extraction surface, whereupon a fine corrugated structure can be formed on the light extraction surface. For example, when an Ar laser light source is applied to the aforesaid laser light source, a formation frequency of the corrugated structure can be reduced to the degree of optical wavelength, whereby a semiconductor light emitting device with an enormously high light extraction efficiency can be manufactured.

Furthermore, as an example of the configuration suitable for control of the shape of corrugated structure, in another aspect of the invention, the above-described etching mask is composed of a plurality of thin film layers. The layers are made from different types of materials having different etching speeds in the case of etching. Consequently, an amount of etching can be controlled so as to take any value, whereupon the etching mask can be controlled so as to have any shape. Accordingly, the etching mask may be shaped so that an amount of side etching (undercut) is increased or so that side etching is suppressed. The corrugated structure with acute distal ends can be formed by increasing an amount of etching.

Furthermore, as an example of arrangement suitable for control of the shape of corrugated structure regarding the direction of the light extraction surface, in an optional aspect of the present invention, exposure is carried out at a plurality of times while an exposure direction is changed. A corrugated structure with a stripe pattern is formed by a single time of exposure. However, for example, when exposure is carried out twice while an exposure direction is changed 90°, a square mask pattern can be formed. The above-described technical idea of the method of manufacturing a semiconductor light-emitting device can be realized in the semiconductor light-emitting device manufactured by the manufacturing method.

Although the invention has been described in considerable detail in language specific to structural features or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

It is to be understood that the phraseology and terminology employed herein, as well as the abstract, are for the purpose of description and should not be regarded as limiting.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. A two-light flux interference exposure device, comprising:
   a laser resonator that includes:
      a laser light source that generates a first laser light;
      a single harmonic generation device that generates a second laser light having a first frequency that is a multiple of a frequency of the first laser light, converting the first laser light output by the laser light source to the second laser light with higher harmonics;
      an etalon receives the second laser light and functions as a narrowband wavelength filter, outputting a third laser light with a predetermined wavelength;
      the third laser light is a narrow-band limited single wavelength laser light with a first wavelength that has a coherence length set to exceed a predetermined length that is longer than a path length that may be traveled by the generated third laser light from the laser resonator;
   the two-light flux interference exposure device further includes:
   a first Neutral Density (ND) filter that adjusts a light intensity of the third laser light to a first light intensity;
   a beam splitter that divides the third laser light into a first light flux and a second light flux, with the first light flux substantially orthogonal to the second light flux;
   the first light flux is reflected from the beam splitter with the first light intensity;
   the second light flux is passed through the beam splitter, which increases the light intensity of the second light flux to a second light intensity;
   the second light intensity of the second light flux is adjusted by a second ND filter to substantially commensurate with the first light intensity, resulting in sharp interference fringes;
   an interference optic system causing the first and second light fluxes to interfere with each other and impinge on a light extraction surface of a semiconductor exposed to the two light flux interferences for a duration;
   with the light extraction surface of the semiconductor oriented at different angles for various exposure durations to the two light flux interferences to form multiple, overlapping sets of overlaying layers of patterns on the light extraction surface of the semiconductor, resulting in formation of a final pattern with sections that have overlapping, multiple levels of exposure to the two light flux interferences;
   with the final pattern processed to constitute a periodic corrugated structure surface that reduces differences between refraction factor of air and the light extraction surface of the semiconductor, resulting in an efficient extraction of light by substantial reduction in reflection thereof.

2. The two-light flux interference exposure device according to claim 1, wherein:
   the laser light source is an Ar laser light source and the single harmonic generation device converts the laser light output by the laser light source into double higher harmonic.

3. The two-light flux interference exposure device according to claim 1, wherein
   the laser light source is an Nd doped YAG laser light source and the single harmonic generation device converts the laser light output by the laser light source into quadruple higher harmonic.

4. The two-light flux interference exposure device according to claim 1, wherein:
   a half-wave plate reducing an orthogonal polarization component of the laser light output outside the laser resonator; and
   a beam expander converting the laser light output outside the laser resonator into parallel light having a predetermined width.

5. A two-light flux interference method, comprising:
   generating a first laser light;
   generates a second laser light having a first frequency that is a multiple of a frequency of the first laser light with higher harmonics;
   receiving the second laser light and generating a third laser light that is a narrow-band limited single wavelength laser light with a first wavelength that has a coherence length set to exceed a predetermined length that is longer than a path length that may be traveled by the generated third laser light; and
   adjusting a light intensity of the third laser light to a first light intensity;
   dividing the third laser light into a first light flux having the first light intensity and a second light flux having a second light intensity, with the first light flux substantially orthogonal to the second light flux;
   adjusting the second light intensity of the second light flux to substantially commensurate with the first light intensity of the first light flux, resulting in sharp interference fringes;
   causing the first and second light fluxes to interfere with each other and impinge on a light extraction surface of a semiconductor exposed to the two light flux interferences for a duration;
   orienting a light extraction surface of the semiconductor at different angles for various exposure durations to the two light flux interferences to form multiple overlapping sets of overlaying layers of patterns on the light extraction surface of the semiconductor, resulting in formation of a final pattern with sections that have overlapping, multiple levels of exposure to the two light flux interferences;

processing the final pattern to constitute a periodic corrugated structure surface that reduces differences between refraction factor of air and the light extraction surface of the semiconductor, resulting in an efficient extraction of light by substantial reduction in reflection thereof.

6. A two-light flux interference exposure device, comprising:
   a laser resonator that includes:
      a laser light source that generates a first laser light;
      a single harmonic generation device that generates a second laser light having a first frequency that is a multiple of a frequency of the first laser light, converting the first laser light output by the laser light source to the second laser light with higher harmonics;
      an etalon receives the second laser light and functions as a narrowband wavelength filter, outputting a third laser light with a predetermined wavelength;
      the third laser light is a narrow-band limited single wavelength laser light with a first wavelength that has a coherence length set to exceed a predetermined length that is longer than a path length that may be traveled by the generated third laser light from the laser resonator;
   the two-light flux interference exposure device further includes:
   a first Neutral Density (ND) filter that adjusts a light intensity of the third laser light to a first light intensity;
   a beam splitter that divides the third laser light into a first light lux and a second light flux, with the first light flux substantially orthogonal to the second light flux;
   the first light flux is reflected from the beam splitter with the first light intensity;
   the second light flux is passed through the beam splitter, which increases the light intensity of the second light flux to a second light intensity;
   the second light intensity of the second light flux is adjusted by a second ND filter to substantially commensurate with the first light intensity, resulting in sharp interference fringes;
   an interference optic system causing the first and second light fluxes to interfere with each other and impinge on a light extraction surface of a semiconductor exposed to the two light flux interferences for a duration;
   with the light extraction surface of the semiconductor oriented at a first angle for a first exposure duration to the two light flux interferences to form a first pattern thereon, and
   with the light extraction surface of the semiconductor oriented at a second angle for a second exposure duration to the two light flux interferences to form a second pattern, overlapping onto the first pattern thereon, resulting in formation of a third pattern with overlapping double exposure sections on the light extraction surface of the semiconductor;
   with the third pattern processed to constitute a periodic corrugated structure surface that reduces differences between refraction factor of air and the light extraction surface of the semiconductor, resulting in an efficient extraction of light by substantial reduction in reflection thereof.

7. The two-light flux interference exposure device according to claim 6, wherein:
   the second angle is orthogonal to the first angle, resulting in the final patter that is comprised of a matrix having an array of substantially square, overlapping double exposure sections on the substrate.

* * * * *